United States Patent
Ren et al.

(10) Patent No.: US 7,494,886 B2
(45) Date of Patent: Feb. 24, 2009

(54) UNIAXIAL STRAIN RELAXATION OF BIAXIAL-STRAINED THIN FILMS USING ION IMPLANTATION

(75) Inventors: Zhibin Ren, Hopewell Junction, NY (US); Katherine L. Saenger, Ossining, NY (US); Haizhou Yin, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/622,524

(22) Filed: Jan. 12, 2007

(65) Prior Publication Data
US 2008/0171426 A1 Jul. 17, 2008

(51) Int. Cl.
*H01L 21/336* (2006.01)
*H01L 21/04* (2006.01)
*H01L 21/425* (2006.01)

(52) U.S. Cl. ........................ 438/303; 438/511; 438/530; 438/938; 252/E21.473

(58) Field of Classification Search .................. 438/197, 438/303, 511; 257/E21.473
See application file for complete search history.

(56) References Cited

U.S. PATENT DOCUMENTS

| 6,689,671 | B1* | 2/2004 | Yu et al. ..................... 438/486 |
| 7,071,046 | B2* | 7/2006 | Yang et al. ................... 438/197 |
| 2004/0227187 | A1 | 11/2004 | Cheng et al. |
| 2005/0139929 | A1 | 6/2005 | Rost |
| 2005/0205934 | A1* | 9/2005 | Lochtefeld et al. .......... 257/347 |
| 2005/0272188 | A1 | 12/2005 | Yeo et al. |
| 2005/0280051 | A1 | 12/2005 | Chidambarrao et al. |
| 2005/0285187 | A1 | 12/2005 | Bryant et al. |
| 2006/0003561 | A1 | 1/2006 | Goktepeli |
| 2007/0045729 | A1* | 3/2007 | Hoentschel et al. ......... 257/344 |
| 2007/0145430 | A1* | 6/2007 | Sandhu et al. .............. 257/288 |
| 2007/0202653 | A1* | 8/2007 | Hoentschel et al. ......... 438/301 |
| 2007/0215859 | A1* | 9/2007 | Clifton ........................ 257/19 |
| 2007/0254441 | A1* | 11/2007 | Wei et al. .................... 438/299 |

FOREIGN PATENT DOCUMENTS

| WO | 2004095552 | 11/2004 |
| WO | 2004095553 | 11/2004 |

\* cited by examiner

*Primary Examiner*—Hsien-ming Lee
*Assistant Examiner*—Kevin A Parendo
(74) *Attorney, Agent, or Firm*—Scully, Scott, Murphy & Presser, P.C.; Robert M. Trepp, Esq.

(57) ABSTRACT

A method for achieving uniaxial strain on originally biaxial-strained thin films after uniaxial strain relaxation induced by ion implantation is provided. The biaxial-strained thin film receives ion implantation after being covered by a patterned implant block structure. The strain in the uncovered region is relaxed by ion implantation, which induces the lateral strain relaxation in the covered region. When the implant block structure is narrow (dimension is comparable to the film thickness), the original biaxial strain will relax uniaxially in the lateral direction.

17 Claims, 5 Drawing Sheets

FIG. 1
(PRIOR ART)
|  | nFET | pFET |
|---|---|---|
| LONGITUDINAL | TENSILE | COMPRESSIVE |
| TRANSVERSE | TENSILE | TENSILE |
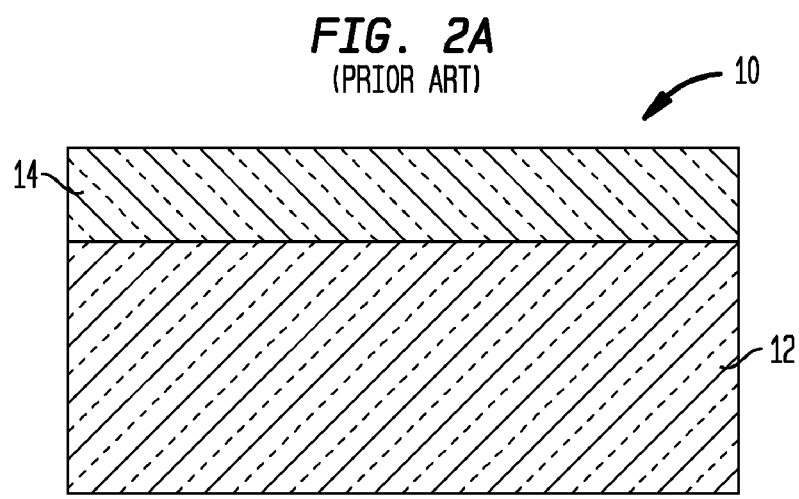
FIG. 2A
(PRIOR ART)
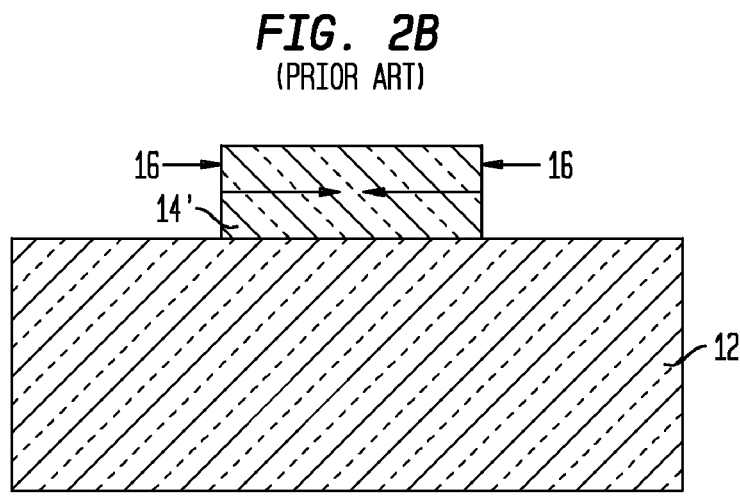
FIG. 2B
(PRIOR ART)

UNIAXIAL STRAIN RELAXATION OF BIAXIAL-STRAINED THIN FILMS USING ION IMPLANTATION

FIELD OF THE INVENTION

The present invention relates to strained semiconductor materials, and more particularly to a method of forming uniaxial strain for enhanced electron and hole mobilities.

BACKGROUND OF THE INVENTION

The conventional miniaturization of metal oxide semiconductor field effect transistors (MOSFETs) has been the driving force in the technology advancement for the semiconductor industry for more than three decades. However, as the device scale reaches the nanometer regime and below, it is increasingly difficult to sustrain the advancement by conventional MOSFET miniaturization. Therefore, methods for improving performance, without scaling, have become increasingly critical. One general approach for doing this is to increase carrier (electron and/or hole) mobilities in MOSFETs. Use of stress on MOSFETs has proved to be an effective way to enhance carrier mobilities in the transistor channel.

As shown in FIG. 1, different semiconductor devices need different strain configuration for optimal performance. For example, silicon-based p-channel field effect transistors (pFETs) require tensile strain in the transverse direction and compressive strain in the longitudinal direction. In contrast, silicon-based n-channel field effect transistors (nFETs) require tensile strain in both transverse and compressive directions.

Biaxial-strained semiconductor substrates have drawn attention for their use in enhancing device performance. For example, epitaxial silicon-germanium (SiGe) grown on silicon substrates is under biaxial compression since the lattice constant of SiGe is larger than that of silicon substrates. Biaxial-strained SiGe is used for high performance pFETs. However, the biaxial compressive strain is not an optimal configuration since the compressive strain in the transverse direction would degrade pFET performance.

In the prior art, it has been demonstrated that uniaxial compressive strain in the longitudinal direction can be achieved by patterning a biaxial compressive SiGe film into a narrow width structure (on the order of about 500 nm or less) as is shown in FIGS. 2A-2B.

Specifically, FIG. 2A illustrates an initial structure 10 that is used in the prior art in which reference numeral 12 represents a substrate that can be a semiconductor material such as silicon, or a buried insulating material such as a buried oxide (BOX). The initial structure 10 of the prior art shown in FIG. 2A also includes a continuous strained film 14 on top of the substrate 12. The continuous strained film 14, which is formed by conventional techniques such as epitaxial growth, is typically SiGe or any other semiconductor whose lattice constant is larger than that of the substrate 12 for the case in which the substrate 12 is a semiconductor such as silicon. If the substrate 12 is a buried oxide, the continuous strained film 14 may be fabricated by wafer bonding.

Photolithography and etching are used to pattern the continuous strained film 14 into a patterned strained film 14'. The strain at each of the edges 16 of the patterned film 14' is relaxed because each edge is now a free surface. This edge relaxation extends from each edge 16 inward towards the middle of the patterned structure. The arrows in FIG. 2B show the direction of the inward edge relaxation for the case in which continuous strained film 14 is tensile. When the width of the patterned structure (i.e., patterned strained film 14') is comparable with its thickness, the edge relaxation will reach the entire pattern and cause the uniaxial strain relaxation laterally.

It is clear from FIGS. 2A-2B that this prior art approach relies on the patterning of the strained film, which would impose requirements on the device geometry and introduce complexity to device design.

In view of the above, it would be desirable to have a method of achieving uniaxial strain relaxation without film patterning.

SUMMARY OF THE INVENTION

The present invention relates to a method for forming uniaxial strain in a continuous biaxially strained semiconductor film by uniaxially relaxing that film without patterning the biaxially strained film. In one aspect of the present invention, a patterned structure (such as an ion implant block mask or a field effect transistor) is formed atop the continuous biaxially strained film. Ion implantation is then performed to form damaged regions and subsequent relaxation within unprotected portions of the biaxially strained semiconductor film. The portion of the biaxially strained semiconductor film covered by the patterned structure relaxes at the boundary of the damaged regions inward in a manner that is similar to that described in the prior art.

As a result of the foregoing processing steps, the continuous biaxially strained semiconductor film is converted into an uniaxially strained semiconductor film. An optional anneal can be performed to heal the damaged portions of the now uniaxially strained film.

In general terms, a method for uniaxially relaxing strain in an originally biaxial strained semiconductor film is provided that comprises:

providing a patterned structure on a surface of a biaxially strained semiconductor film, said patterned structure protects at least one portion of said film while leaving at least one other portion of said film exposed; and performing an ion implant into said at least one other portion of said film not covered by said patterned structure, wherein said ion implant damages said at least one other portion of said film and causes strain relaxation in said at least one other portion of said film, while inducing lateral strain relaxation in said at least one portion of said film that is protected by said patterned structure.

An embodiment of the present invention is uniaxial strain relaxation by utilizing a patterned ion implant block mask as the patterned structure. The steps of this embodiment of the present invention comprise providing a patterned ion implant block mask which has a dimension that is comparable with the thickness of the underlying biaxially strained semiconductor film; performing ion implantation to relax the strain in the exposed strained film; and removing the implant block mask. An optional annealing step may be performed to repair the implant damages. By having 'a dimension that is comparable with the thickness of the strained film' it is meant that the size of the dimension is less than five times of the thickness of the strained film.

Another embodiment of the present invention is the use of a device (e.g., FET) gate and spacer as a patterned structure for ion implant block purpose. In this embodiment of the present invention, the steps include forming a patterned structure including a patterned gate stack and a sidewall spacer atop a biaxially strained semiconductor layer; ion implanting into the exposed regions of the strained semiconductor layer to uniaxially relax that layer; and optionally annealing to repair the implant-induced damages.

In both of the embodiments mentioned above, a continuous biaxially strained semiconductor film is converted into a uniaxially strained semiconductor film.

BRIEF DESCRIPTION OF THE DRAWINGS

FIG. 1 is a Table illustrating the desirable strain configuration for silicon-based nFETs and pFETs.

FIGS. 2A-2B are pictorial representations (through cross sectional views) showing the uniaxial strain relaxation by mesa formation in the prior art.

DETAILED DESCRIPTION OF THE INVENTION

Figure 3A:
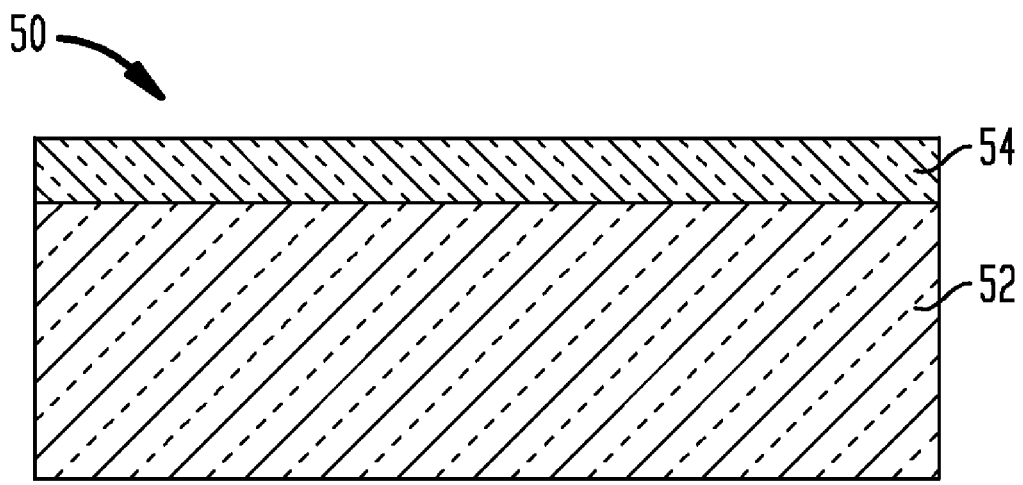
FIGS. 3A-3E are pictorial representations (through cross sectional views) illustrating the process flow of uniaxial strain relaxation of a strained film using a patterned ion implant block mask and ion implantation in accordance with an embodiment of the present invention.

The present invention, which provides a method of achieving uniaxial strain relaxation of an originally biaxially strained semiconductor film without subjecting the film to patterning prior to uniaxial strain relaxation, will now be described in greater detail by referring to the following discussion and drawings that accompany the present application. It is noted that the drawings of the present application are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced with viable alternative process options without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present invention involves uniaxial strain relaxation of an originally biaxial strained semiconductor film. The present invention enables uniaxial strain on an originally biaxial strained semiconductor film, without the need to pattern the film prior to relaxation. The inventive method can be used for enhancing hole mobility in pFET devices. In this regard, it is well known that biaxially strained silicon has higher electron mobility. However, hole mobility is degraded due to the longitudinal tensile strain. The inventive method can be used to relax the undesirable longitudinal tensile strain, therefore enhancing pFET performance.

In accordance with the present invention, a patterned structure (such as mask or a field effect transistor) is formed atop a continuous biaxially strained semiconductor film. Ion implantation is then performed to form damaged regions and subsequent uniaxial relaxation within unprotected portions of the biaxially strained semiconductor film. The portion of the biaxially strained semiconductor film covered by the patterned structure relaxes at the boundary of the damaged regions inward in a manner that is similar to that described in the prior art.

In accordance with the present invention, the patterned structure may comprise an ion implant block mask or the gate and spacers of a field effect transistor. These two embodiments of the present invention will now be described in greater detail.

FIGS. 3A-3E illustrate the process of achieving uniaxial strain relaxation of an originally biaxial strained semiconductor film using an ion implant block mask. Specifically, this embodiment begins by first providing a structure 50 (see FIG. 3A) including a continuous biaxially strained semiconductor film 54 on a surface of a supporting structure 52.

In accordance with the present invention, the biaxially strained semiconductor film 54 comprises strained silicon, strained SiGe, or any other strained semiconductor material. The biaxially strained semiconductor film 54 may be under tensile strain or compressive strain depending on the material of the film 54 and the technique used for forming the same.

The thickness of the biaxially strained semiconductor film 54 may vary depending on the technique that is used in forming the same atop a surface of the supporting structure 52. Typically, the biaxially strained semiconductor film 54 has a thickness from about 10 nm to about 200 nm, with a thickness from about 20 nm to about 90 nm being even more typical.

The biaxially strained semiconductor film 54 may be formed utilizing techniques well known to those skilled in the art. For example, the biaxially strained semiconductor film 54 is formed by epitaxial growth, SiGe condensation, and other like techniques. Biaxial tensile silicon can be obtained by epitaxial growth of silicon on a relaxed SiGe buffer because the lattice constant of relaxed SiGe is larger than unstrained silicon. Biaxial-compressive SiGe can be obtained by epitaxial growth of SiGe on a relaxed silicon for the same reason.

The supporting structure 52 comprises a silicon substrate, a relaxed SiGe substrate, a buried insulating material such as an oxide, or other materials. The thickness of the supporting structure 52 is not critical to the present invention. When the supporting structure 52 is a buried insulating material, the biaxially strained semiconductor film 54 may be formed by layer transfer techniques well known to those skilled in the art.

Figure 3B:
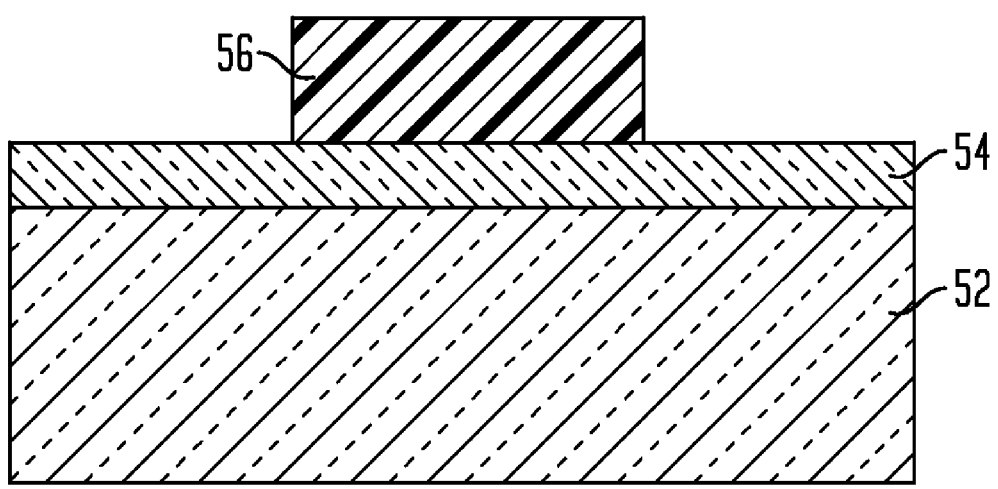

A patterned ion implant block mask 56 is then formed atop the biaxially strained semiconductor film 54 providing the structure shown, for example, in FIG. 3B. Specifically, the patterned ion implant block mask 56 is formed by first providing a blanket layer of an ion implant block mask film on the surface of the biaxially strained semiconductor film 54 utilizing a conventional deposition technique such as, for example, chemical vapor deposition (CVD), plasma enhanced chemical vapor deposition (PECVD), chemical solution deposition, evaporation or spin-coating.

The blanket layer of the ion implant block mask film may comprise a photoresist (inorganic, organic or hybrid-type), or a dielectric material or stack including at least one of an oxide, nitride and an oxynitride.

If the blanket layer of the implant block mask film is made of a photoresist, lithograpy is used to pattern the photoresist into the ion implant block mask 56. As is known to those skilled in the art, lithography includes exposing the photoresist to a desired pattern of radiation and then developing the exposed photoresist utilizing a conventional resist developer. When the blanket layer of the implant block film is comprised of a dielectric or a dielectric stack, the following steps are needed to pattern the same into the implant block mask 56: a photoresist is first applied to the dielectric, lithography is then used to pattern the photoresist and a subsequent etch step is used to pattern the dielectric. The etch process could be either a wet etch or a dry etch. Drying etching includes one of reactive ion etching (RIE), plasma etching, ion beam etching and laser ablation. Typically, RIE is used to transfer the pattern from the resist to the underlying dielectric.

In accordance with the present invention, the ion implant block mask 56 needs to be thick enough to block subsequent ion implantation. Generally, the block of ions during a subsequent ion implantation process by the implant block mask 56 can be achieved when the thickness of the mask 56 is from about 100 nm to a few microns; the thickness depends on the mask's blocking capability and the implant conditions.

Figure 3C:
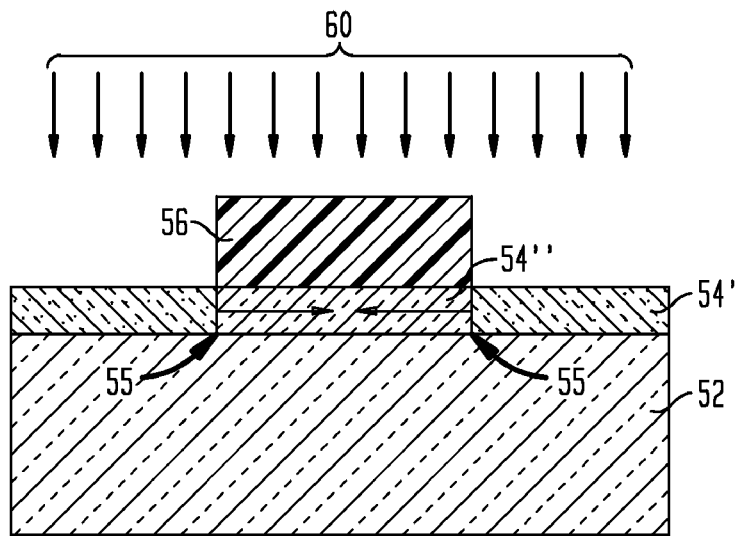

After the ion implant block mask 56 is formed, an ion implantation is performed to inflict damages to exposed portions of the biaxially strained semiconductor film 54 that are not protected by the ion implant block mask 56. The ion implantation step is shown in FIG. 3C in which reference numeral 60 is used to denote the implantation ions. As a result of this ion implantation step, the damaged regions 54' of the strained semiconductor film 54 are relaxed. The implant species that can be employed in the present invention comprises Ge, Xe, Si, As and other ions. Combinations of the aforementioned implant species are also contemplated in the present invention. In one embodiment of the present invention, Xe is preferred as the implanting species.

The implant energy and dose vary depending on the ion species selected. For example and when Ge is employed, the following ion implantation conditions can be employed: an implant energy from about 20 to about 40 keV and an implant dose from about 1E14 to about 1E15 Ge atoms/cm$^2$. When Si is employed as the implant species, the following ion implantation conditions can be employed: an implant energy from about 10 to about 25 keV and an implant dose from about 1E14 to about 1E15 Si atoms/cm$^2$. When Xe is employed as the implant species, the following ion implantation conditions can be employed: an implant energy from about 20 to about 50 keV and an implant dose from about 1E13 to about 2E14 Xe atoms/cm$^2$. When As is employed as the implant species, the following ion implantation conditions can be employed: an implant energy from about 25 to about 60 keV and an implant dose from about 2E13 to about 5E14 As atoms/cm$^2$.

In one aspect of the present invention, the conditions used for the ion implantation are sufficient to provide a projected implant depth from about 15 to about 80 nm into the biaxially strained semiconductor film 54. Depending on the ion implantation conditions, the exposed region may or may not be amorphized; amorphization is typically achieved when the implant dose is high enough.

When the exposed regions of the biaxially strained semiconductor layer 54 are relaxed by implantation, each edge 55 of the protected region or portion of the biaxially strained semiconductor film 54 becomes relaxed in the lateral direction since there is no lateral stress in the implanted region to maintain the stress in the protected region. The edge-induced relaxation will extend toward the center of the protected region of the biaxially strained semiconductor film 54. When the dimension of the protected region is comparable with the thickness of the strained semiconductor film 54, the edge relaxation can reach across the protected region converting that region into an uniaxial strained semiconductor region 54". As such, the original strain in the protected region will be uniaxially relaxed in the longitudinal direction.

Figure 3D:
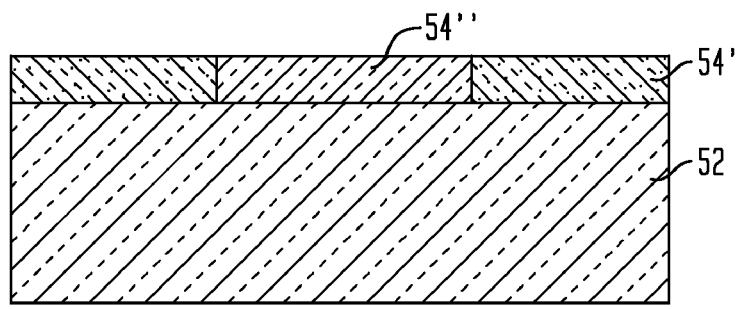

FIG. 3D illustrates the structure that is formed after the ion implant block mask 56 has been removed from the structure. Any conventional stripping process can be employed in the present invention in removing the ion implant block mask 54.

Figure 3E:
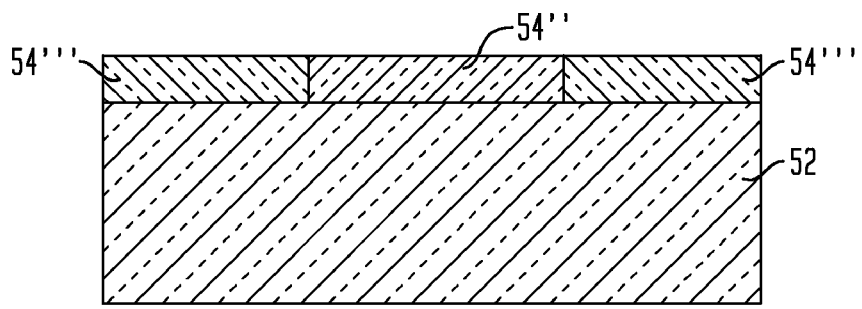

In FIG. 3E, an optional anneal can be carried out to heal the damages in the implanted region forming uniaxial strained regions 54'''. The optional anneal is performed at a temperature range from about 550° C. to about 700° C. The duration of the anneal varies from a few seconds to tens of minutes. The optional anneal is generally performed in an inert ambient such as He, Ar, Ne or a mixture of such inert gasses can also be used.

Figure 4A:
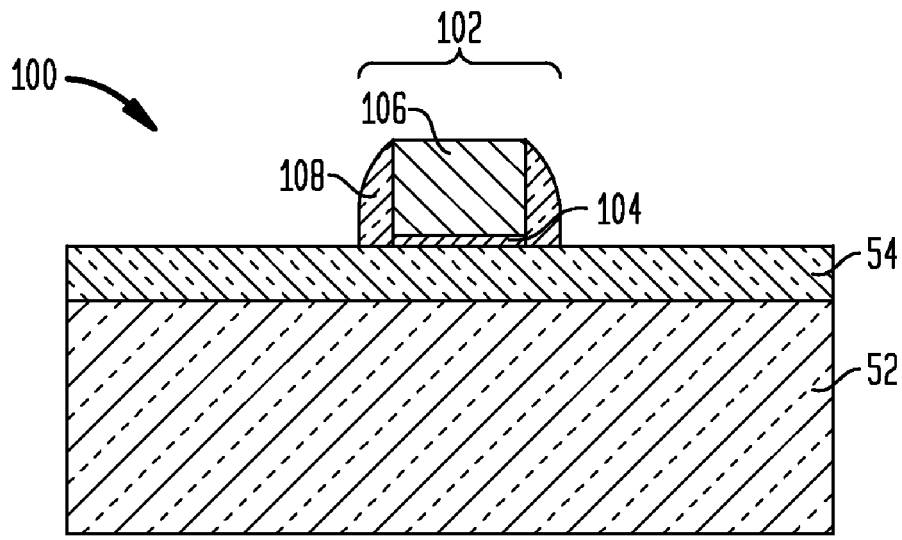
FIGS. 4A-4C are pictorial representations (though cross sectional views) illustrating the process flow of achieving uniaxial strain relaxation in a device channel which is fabricated on an originally biaxial-strained film in accordance with another embodiment of the present invention.
Figure 4B:
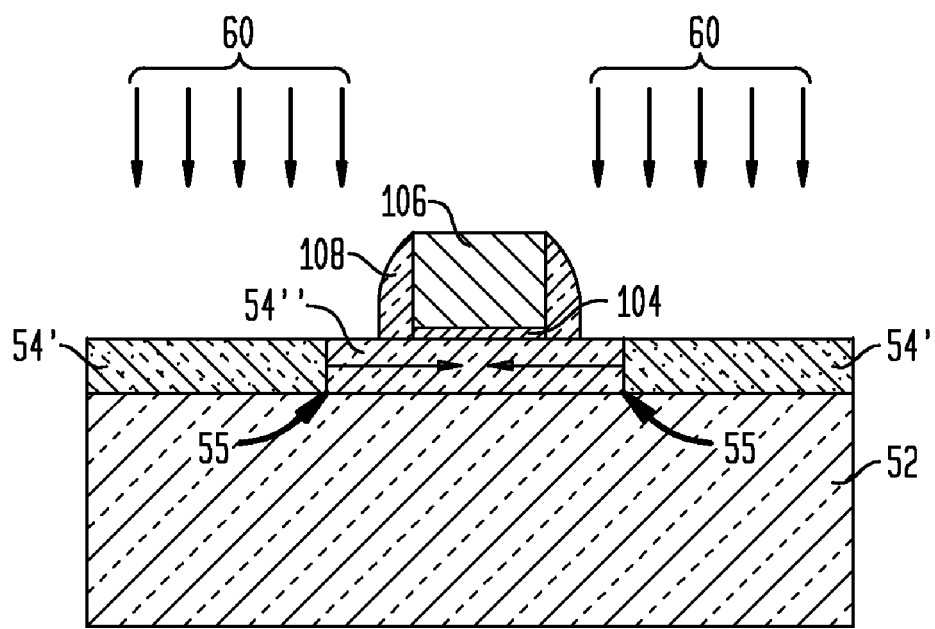
Figure 4C:
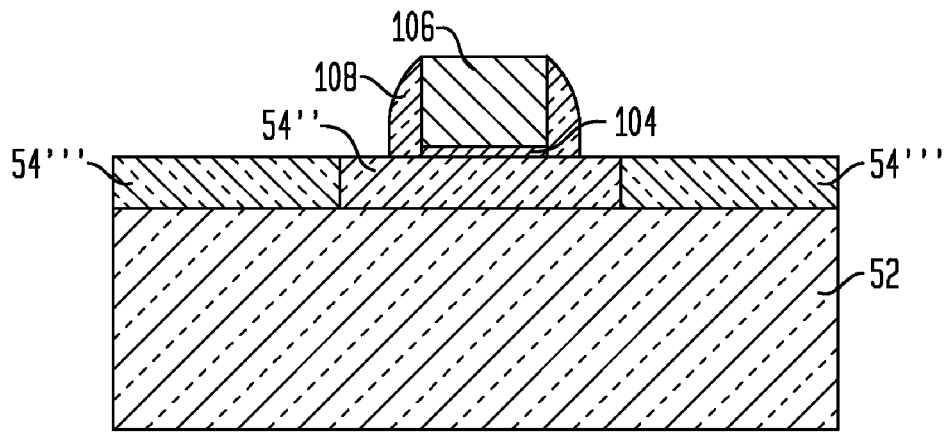

FIGS. 4A-4C illustrate the uniaxial strain relaxation on a structure made on a biaxially strained semiconductor film 54 which is located on a surface of a supporting structure 52. In a preferred embodiment, the structure is a pFET and the biaxially strained semiconductor film 54 has a tensile strain. One key feature of this preferred embodiment of the present invention is uniaxial strain relaxation in the longitudinal direction (device channel length direction), which leads to significant pFET drive current enhancement.

FIG. 4A shows the cross section of an initial structure 100 that is employed in this embodiment of the present invention. As is illustrated in FIG. 4A, the initial structure 100 includes a supporting structure 52, a biaxially strained semiconductor film 54 located on a surface of the supporting structure 52, and a patterned structure comprises a FET 102 located on film 54. In a preferred embodiment, the biaxially strained semiconductor layer 54 is biaxial-tensile silicon which is usually fabricated by epitaxial silicon growth on a relaxed SiGe supporting support.

The FET 102 includes a patterned gate stack comprising at least a gate dielectric 104 and a gate conductor (or electrode) 106 located on a surface of the strained semiconductor film 54. The region of the semiconductor film 54 beneath the FET forms the channel of the FET device. The gate dielectric 104 is comprised of a conventional dielectric material including an oxide, nitride, oxynitride or multilayers thereof. The gate conductor (or electrode) 106 provides electrical control over the gate dielectric 104 and it modulates the carrier density in the device channel. The gate conductor (or electrode) 106 is made of a Si-containing material (such as polySi or SiGe), an elemental metal, an alloy of an elemental metal, a metal silicide or any other conducting material.

The formation of the patterned gate stack is formed by conventional CMOS processing steps that are well known to those skilled in the art. In order not to obscure the present invention, the details of such processing steps are omitted.

As is shown, the patterned structure also includes a spacer 108, which covers the sidewalls of the patterned gate stack. The spacer 108 is made of an oxide, a nitride, an oxynitride or multilayers thereof and it is used for the subsequent uniaxial strain relaxation process. Deposition and RIE are typically used to form the spacer 108.

In general, various dopings (including halo, extension, and source/drain) can be performed independent of this uniaxial strain relaxation process. Therefore, such dopings are carried out either before or after the inventive uniaxial strain relaxation process. In one embodiment of the present invention, the spacer 108 is made of oxide and it is used for both doping implants and the uniaxial strain relaxation process.

The spacer 108 and the pattern gate stack serve as implant block in the ion implantation process such in FIG. 4B. In this drawing, reference numeral 60 denotes the implanting ions, reference numeral 54' denotes the damaged and relaxed portions of the original biaxial strained semiconductor film 54, and reference numeral 54" denotes the channel region of the structure that is uniaxially relaxed by edge relaxation. The channel region 54" of the FET device is protected from this implant, which is utilized to relax the strain in the biaxially strained layer 54. Once the exposed regions of the strained semiconductor film 54 are relaxed, the original longitudinal strain in the channel is relaxed by edge relaxation. Because the length and thickness of the channel region are comparable, the edge relaxation reaches across the entire channel region.

FIG. 4C shows the structure after performing the annealing step which heals the damages within regions 54' converting them into substantially undamaged region 54'''.

Figure 5:
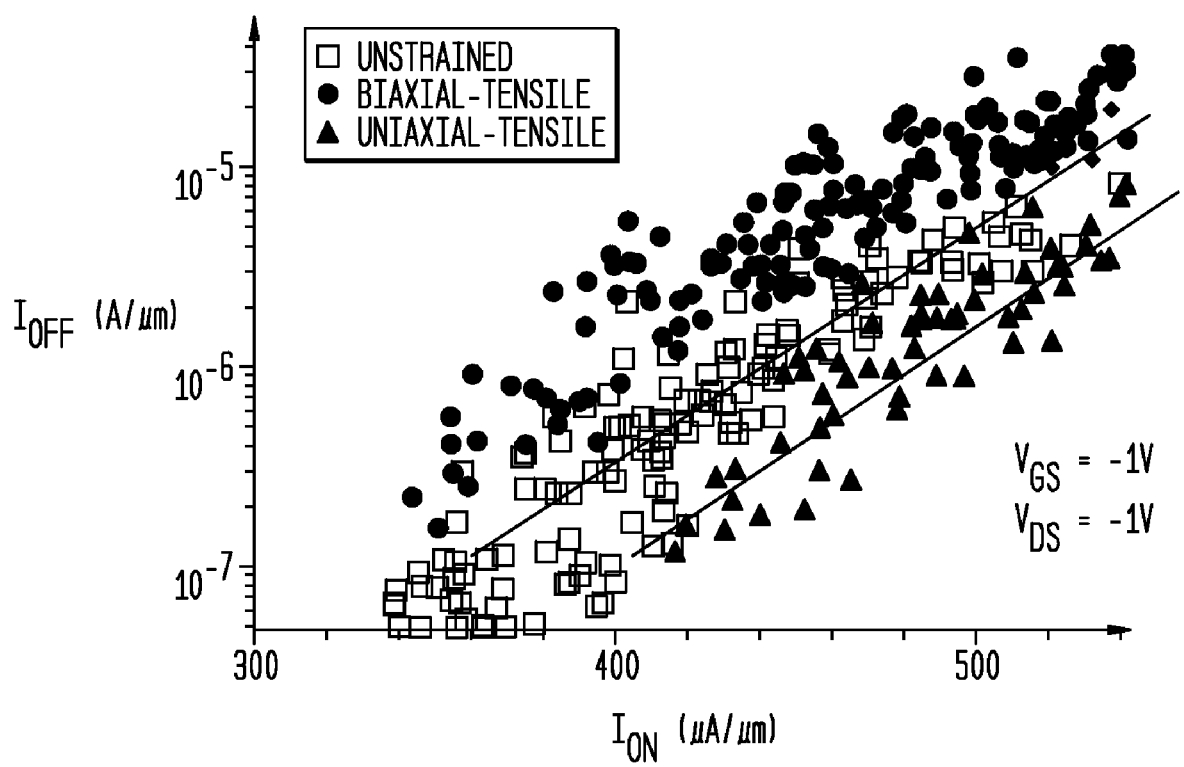
FIG. 5 shows the drive current as a function of off current in pFETs for unstrained Si, biaxial-tensile Si, and uniaxial-tensile Si.

FIG. 5 shows the pFET drive current benefit of the uniaxial strain relaxation. The biaxial-tensile pFETs show drive current degradation at the same off current as compared to unstrained pFETs because of the undesirable longitudinal tensile strain (FIG. 1). After the uniaxial strain relaxation process in the longitudinal direction as described above, the pFETs show big drive current enhancement.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method for uniaxially relaxing strain in a biaxially strained semiconductor film comprising:
    providing a patterned structure on a surface of said biaxially strained semiconductor film, said patterned structure comprising an ion implant block mask having a length less than five times a thickness of said biaxially strained semiconductor film, said patterned structure protecting at least one portion of said film while leaving at least one other portion of said film exposed; and
    performing an ion implant into said at least one other portion of said film, wherein said ion implant damages said at least one other portion of said film and causes strain relaxation in said at least one other portion of said film, while inducing lateral strain relaxation in said at least one portion of said film that is protected by said patterned structure.

2. The method of claim 1 further comprising an annealing step that heals said damages caused by said ion implant.

3. The method of claim 1 wherein said ion implant block mask is a photoresist, a dielectric material, or a dielectric stack.

4. The method of claim 1 wherein said biaxially strained semiconductor film comprises tensile strained silicon or compressive strained silicon.

5. The method of claim 1 wherein said ion implant comprises implantation of an ion species comprising at least one of Ge, Xe, Si and As.

6. The method of claim 1 wherein said ion implant is performed under conditions that are effective in amorphizing said at least one other portion of said film not covered by said patterned structure.

7. The method of claim 1 wherein said biaxially strained semiconductor film comprises tensile strained Si and said patterned structure is a pFET including a patterned gate stack and a spacer located on sidewalls of said patterned gate stack.

8. A method for uniaxially relaxing strain in a biaxially strained semiconductor film comprising:
    forming an ion implant block mask over the biaxially strained semiconductor film, said ion implant block mask having a length less than five times a thickness of said biaxially strained semiconductor film and protecting at least one portion of said film while leaving at least one other portion of said film exposed; and
    performing an ion implant into said at least one other portion of said film, wherein said ion implant damages said at least one other portion of said film and causes strain relaxation in said at least one other portion of said film, while inducing lateral strain relaxation in said at least one portion of said film.

9. The method of claim 8 further comprising an annealing step that heals said damages caused by said ion implant.

10. The method of claim 8 wherein said biaxially strained semiconductor film comprises tensile strained silicon or compressive strained silicon.

11. The method of claim 8 wherein said ion implant comprises implantation of an ion species comprising at least one of Ge, Xe, Si and As.

12. The method of claim 8 wherein said ion implant is performed under conditions that are effective in amorphizing said at least one other portion of said film not covered by said ion implant block mask.

13. A method for uniaxially relaxing strain in a biaxially strained semiconductor film comprising
    providing a patterned structure comprising a patterned gate stack and a sidewall spacer on a surface of the biaxially strained semiconductor film, said patterned structure protecting at least one portion of said film while leaving at least one other portion of said film exposed, the patterned gate stack and the sidewall spacer having a length less than five times a thickness of said biaxially strained semiconductor film; and
    performing an ion implant into said at least one other portion of said film, wherein said ion implant damages said at least one other portion of said film and causes strain relaxation in said at least one other portion of said film, while inducing lateral strain relaxation in said at least one portion of said film.

14. The method of claim 13 further comprising an annealing step that heals said damages caused by said ion implant.

15. The method of claim 13 wherein said ion implant comprises implantation of an ion species comprising at least one of Ge, Xe, Si and As.

16. The method of claim 13 wherein said biaxially strained semiconductor film comprises tensile strained Si and said patterned structure is a pFET.

17. The method of claim 13 wherein said ion implant is performed under conditions that are effective in amorphizing said at least one other portion of said film not covered by said patterned structure.

* * * * *